(12) United States Patent
Park et al.

(10) Patent No.: US 7,169,651 B2
(45) Date of Patent: Jan. 30, 2007

(54) PROCESS AND LEAD FRAME FOR MAKING LEADLESS SEMICONDUCTOR PACKAGES

(75) Inventors: HyungJun Park, Paju-Si (KR); HyeongNo Kim, Paju-Si (KR); SangBae Park, Paju-Si (KR); YongGil Lee, Paju-Si (KR); KyungSoo Rho, Paju-Si (KR); JunYoung Yang, Paju-Si (KR); JinHee Won, Paju-Si (KR)

(73) Assignee: Advanced Semiconductor Engineering, Inc., Kaosiung (TW)

( * ) Notice: Subject to any disclaimer, the term of this patent is extended or adjusted under 35 U.S.C. 154(b) by 262 days.

(21) Appl. No.: 10/915,367

(22) Filed: Aug. 11, 2004

(65) Prior Publication Data

US 2006/0035414 A1    Feb. 16, 2006

(51) Int. Cl.
*H01L 21/48* (2006.01)
*H01L 21/50* (2006.01)
*H01L 21/56* (2006.01)
*H01L 21/60* (2006.01)

(52) U.S. Cl. .................. 438/124; 438/113; 438/464

(58) Field of Classification Search ............ 438/111, 438/112, 123, 124, 464, 113
See application file for complete search history.

(56) References Cited

U.S. PATENT DOCUMENTS

| | | | |
|---|---|---|---|
| 6,261,864 B1 | 7/2001 | Jung et al. | 438/106 |
| 6,333,252 B1 | 12/2001 | Jung et al. | 438/612 |
| 6,342,730 B1 | 1/2002 | Jung et al. | 257/692 |
| 6,489,218 B1 | 12/2002 | Kim et al. | 438/460 |
| 6,495,909 B2 | 12/2002 | Jung et al. | 257/684 |
| 6,528,893 B2 | 3/2003 | Jung et al. | 257/787 |
| 6,773,961 B1 | 8/2004 | Lee et al. | 438/112 |
| 6,872,599 B1* | 3/2005 | Li et al. | 438/123 |
| 6,933,594 B2* | 8/2005 | McLellan et al. | 257/676 |
| 7,087,461 B2* | 8/2006 | Park et al. | 438/112 |
| 7,087,462 B1* | 8/2006 | Park et al. | 438/112 |

\* cited by examiner

*Primary Examiner*—M. Wilczewski
*Assistant Examiner*—Seth Barnes
(74) *Attorney, Agent, or Firm*—Pillsbury Winthrop Shaw Pittman LLP

(57) ABSTRACT

A process for making a plurality of leadless packages is disclosed. Firstly, chips are attached onto a lead frame with a first metal layer formed thereon. After a wire bonding step and an encapsulating step are conducted, a portion of each lead of the lead frame is etched away to form a first connection pad and a second connection pad which are separated from each other but are still electrically connected to each other via the first metal layer therebetween. Then, a second metal layer is electroplated on the connection pads and the die pads by using the first metal layer as an electrical path. Finally, the first metal layer between the first connection pads and the second connection pads is removed, and a singulation step is conducted to complete the process. The present invention further provides a new lead frame design.

22 Claims, 8 Drawing Sheets

PROCESS AND LEAD FRAME FOR MAKING LEADLESS SEMICONDUCTOR PACKAGES

BACKGROUND OF THE INVENTION

1. Field of the Invention

This invention relates to a process and a lead frame for making leadless semiconductor packages.

2. Description of the Related Art

Lead frame packages have been used for a long period of time in the IC packaging history mainly because of their low manufacturing cost and high reliability. However, as integrated circuits products move its endless pace toward both a faster speed and a smaller size, the traditional lead frame packages have become gradually obsolete for some high performance-required packages. Thus BGA (Ball Grid Array Packages) and CSP (Chip Scale Package) have emerged and become increasingly popular as a new packaging choice.

However, the lead frame package still remains its market share as a cost-effective solution for low I/O ICs. Traditional lead frame package has its limit of providing a solution for chip scale and low profile package due to the long inner leads and outer leads. Therefore, the semiconductor packaging industry develops a leadless package without outer leads such that both the footprint and the package profile can be greatly reduced. Due to the elimination of the outer leads, leadless packages are featured by lower profile and light weight. Furthermore, due to the lead length reduction, the corresponding reduction in the resistance, conductance and capacitance make the leadless package very suitable for RF (radio-frequency) product packages operating in several GHz to tens of GHz frequency range. It's also a cost-effective package due to its use of existing BOM (bill of materials). All the above-mentioned properties make the current leadless packages very suitable for telecommunication products such as cellular phones, portable products such as PDA (personal digital assistant), digital cameras, and IA (Information Appliance).

FIGS. 1–2 show a conventional leadless package 10 including a chip 12 disposed on a die pad 11*b* sealed in a package body 13. The chip 12 is provided with a plurality of bonding pads electrically connected to leads 11*a*. The leads 11*a* are exposed from the lower surface of the package body 13 for making external electrical connection.

However, the conventional leadless package 10 has various design and production limitations. For example, in order to reduce the size of the package while not increasing the number of I/O connections or to increase the number of I/O connections while not increasing the package size, the density of the leads 11*a* should be increased since the leads 11*a* are only arranged about the lateral periphery of the package 10. This is especially apparent when the chip 12 has high density and high frequency digital circuitry. Such an increase in the density of leads inherently requires a reduced pitch or spacing between adjacent leads thereby increasing likelihood of cross-talk and signal interference and making such packages more difficult to fabricate.

SUMMARY OF THE INVENTION

It is therefore an object of the present invention to provide a process for making a plurality of staggered multi-row leadless packages that satisfy the need for a significantly higher number of connection pads in a smaller footprint.

It is another object of the present invention to provide a lead frame designed to make the aforementioned staggered multi-row leadless packages.

According to one aspect of the invention, a process having features of the present invention includes the following steps. Firstly, a plurality of chips are attached onto the die pads of a lead frame with a first metal layer formed on the entire upper surface thereof, and each lead of the lead frame is electrically coupled to two different bonding pads of one of the chips. After a tape is attached onto the lower surface of the lead frame, the chips are encapsulated against the upper surface of the lead frame to form a molded product. After the tape is removed from the bottom of the molded product, the dambars of the lead frame are etched away to form a plurality of grooves and a portion of each lead of the lead frame is etched away to form a first connection pad and a second connection pad. Note that the first connection pad and the second connection pad are separated from each other but are still electrically connected to each other via the first metal layer therebetween. Then, a second metal layer is electroplated on the first connection pads, the second connection pads and the die pads by using the first metal layer as an electrical path. Thereafter, the first metal layer located between the first connection pads and the second connection pads is removed to electrically isolate the first connection pads from the second connection pads. Finally, a singulation step is conducted to obtain the leadless semiconductor packages. Note that each lead of the lead frame is selectively etched away a portion thereof thereby forming two rows of connection pads. In this way, the number of I/O connections is significantly increased while the pitch or spacing between adjacent leads is not required to be reduced. Accordingly, the finished leadless semiconductor packages satisfy the need for a significantly higher number of connection pads in a smaller footprint.

A typical lead frame for making a plurality of leadless semiconductor package generally includes a plurality of units in an array arrangement and a plurality of dambars between the units. Each unit of the lead frame includes a die pad for receiving a semiconductor chip and a plurality of tie bars for connecting the die pad to the dambars.

According to another aspect of the invention, there is provided a lead frame designed to make the staggered multi-row leadless packages. The lead frame includes outer and inner leads arranged about the periphery of the die pad in each unit. Each of the outer leads is connected to one of the dambars. Each of the inner leads is disposed between the outer leads and the die pad, and the inner leads are connected to each other and the tie bars.

The present invention further provides a process for making a plurality of staggered multi-row leadless packages using the lead frame just described above. This process is substantially identical to the aforementioned process with an exception that an etching step is conducted to selectively remove the connecting portions between the inner leads of the lead frame such that the inner leads are separated from each other but are still electrically connected to each other via the first metal layer therebetween.

BRIEF DESCRIPTION OF THE DRAWINGS

These and other features, aspects, and advantages of the present invention will be more fully understood by reading the following detailed description of the preferred embodiment, with reference made to the accompanying drawings as follows.

DETAILED DESCRIPTION OF THE PREFERRED EMBODIMENT

Figure 1:
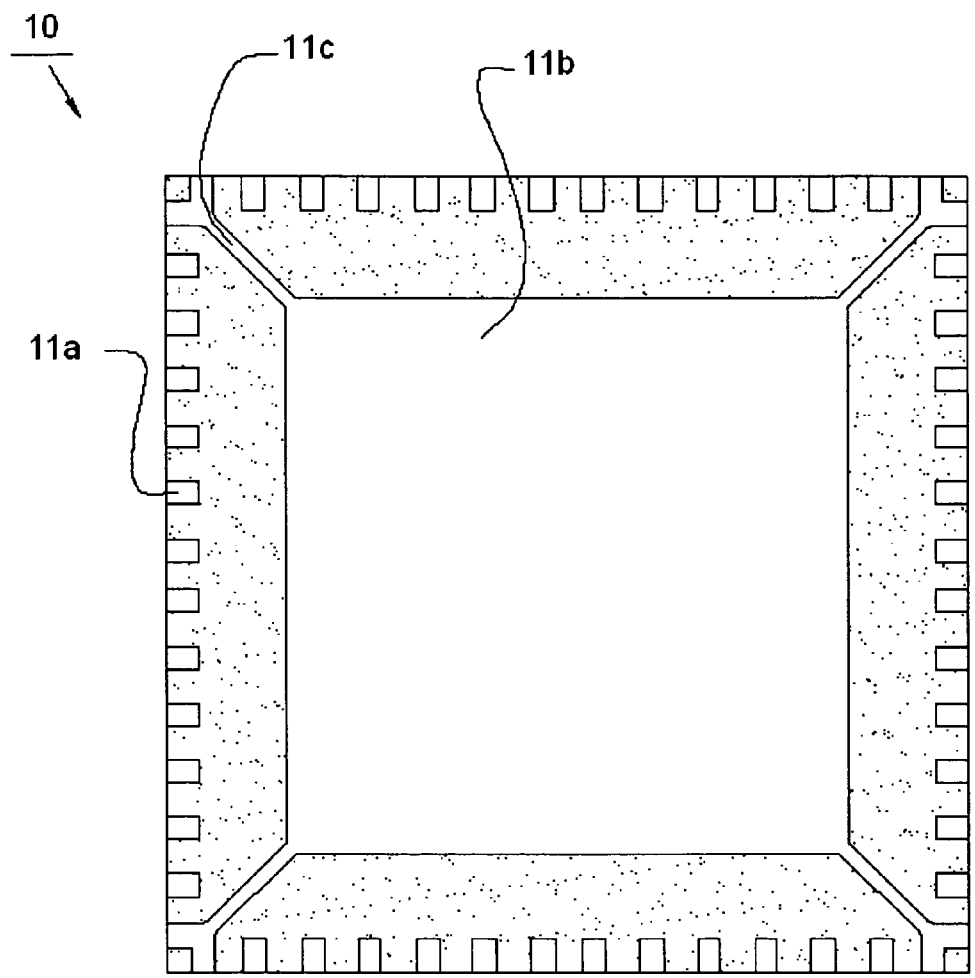
FIG. 1 is a bottom view of a conventional leadless package.
Figure 2:
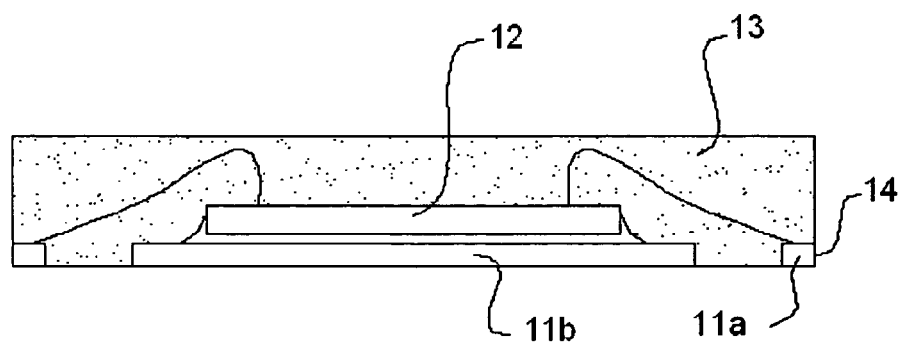
FIG. 2 is a cross sectional view of the leadless package of FIG. 1.
Figure 3A:
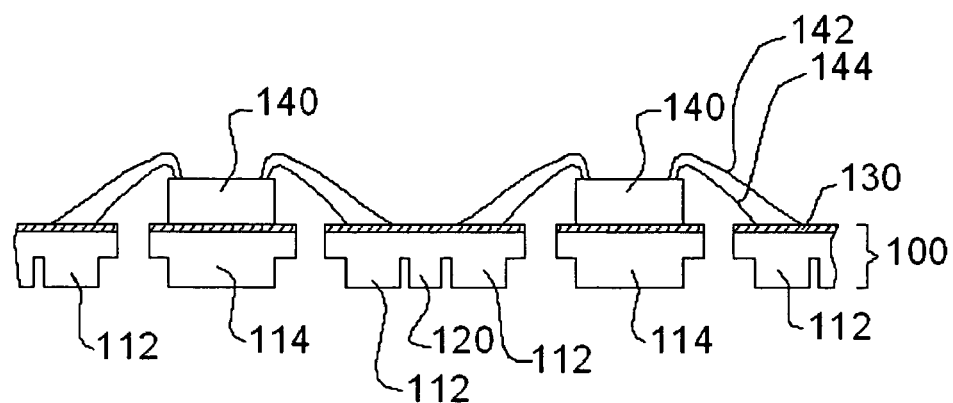
FIGS. 3a to 3k illustrate in cross-section major steps of a process for making a plurality of staggered dual-row leadless packages according to one embodiment of the present invention.
Figure 3B:
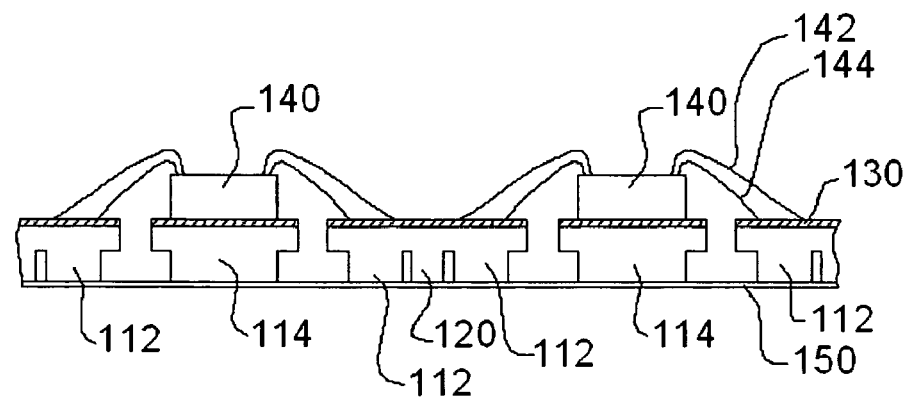
Figure 3C:
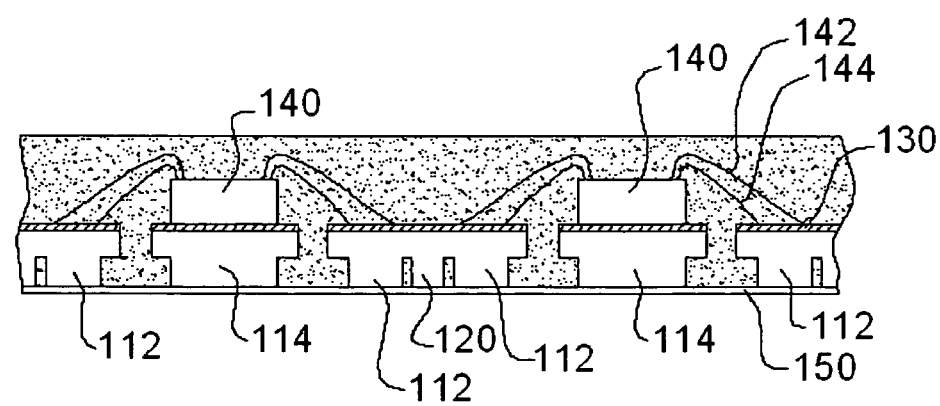
Figure 3D:
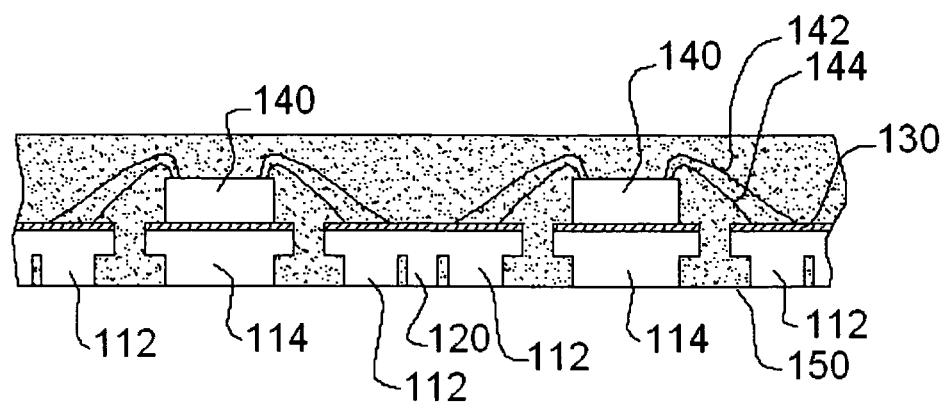
Figure 3E:
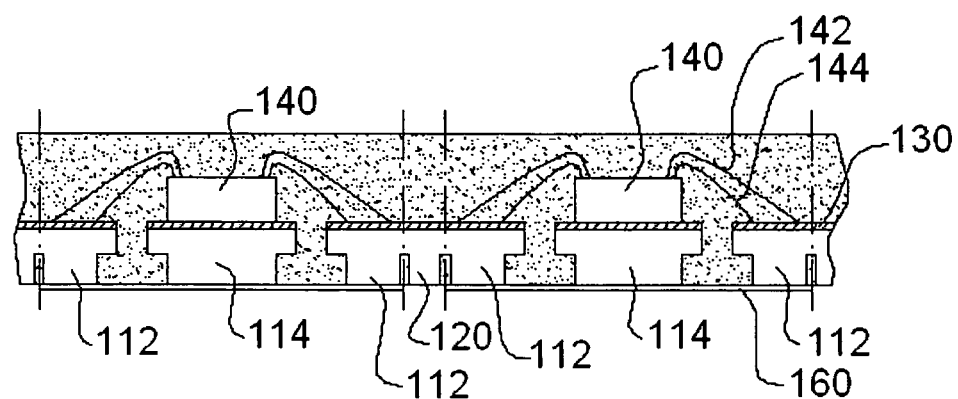
Figure 3F:
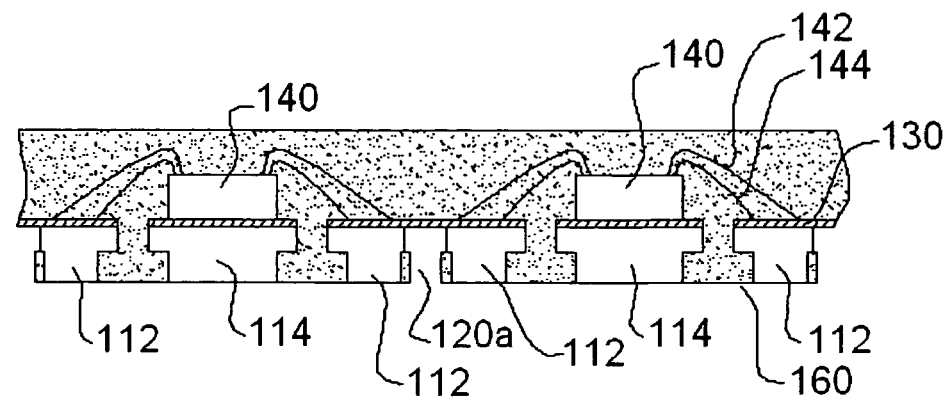
Figure 3G:
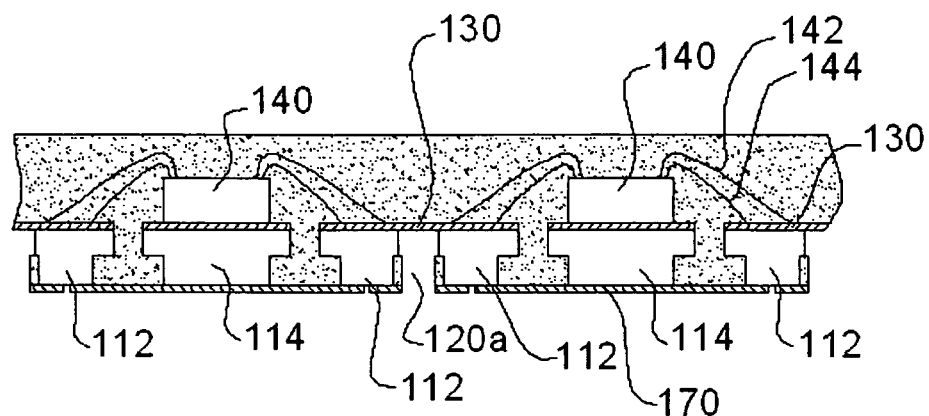
Figure 3H:
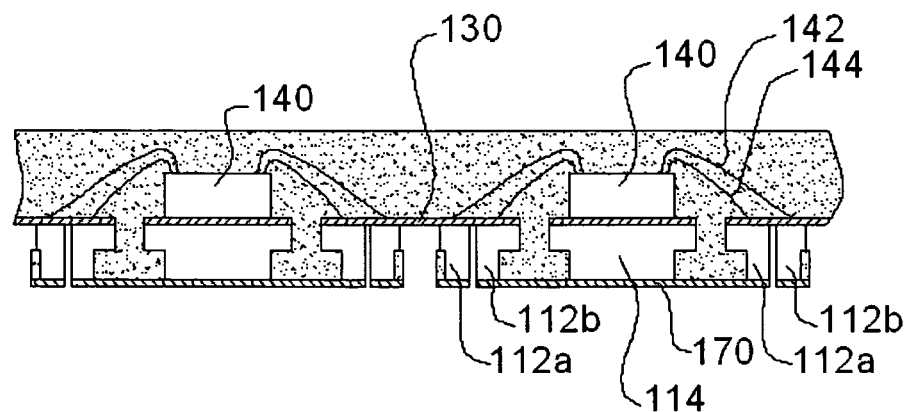
Figure 3I:
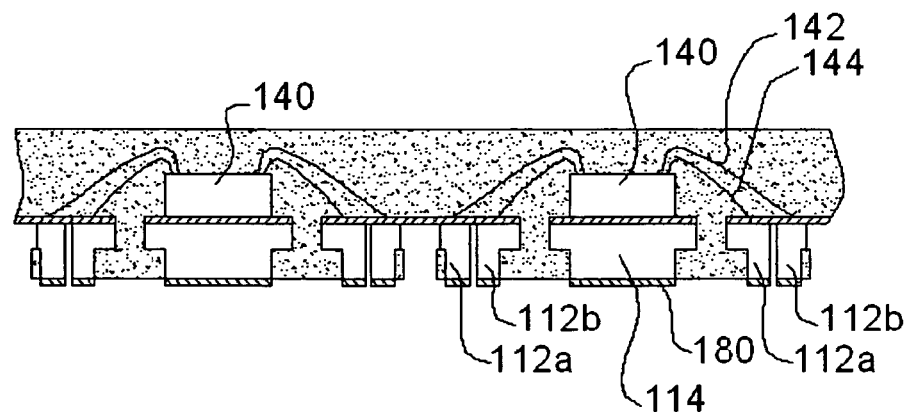
Figure 3J:
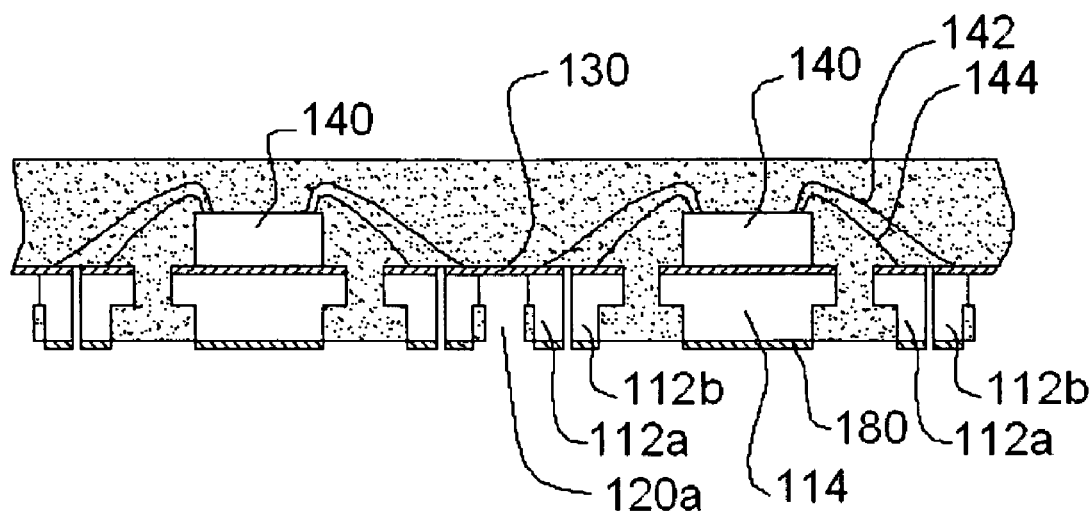
Figure 3K:
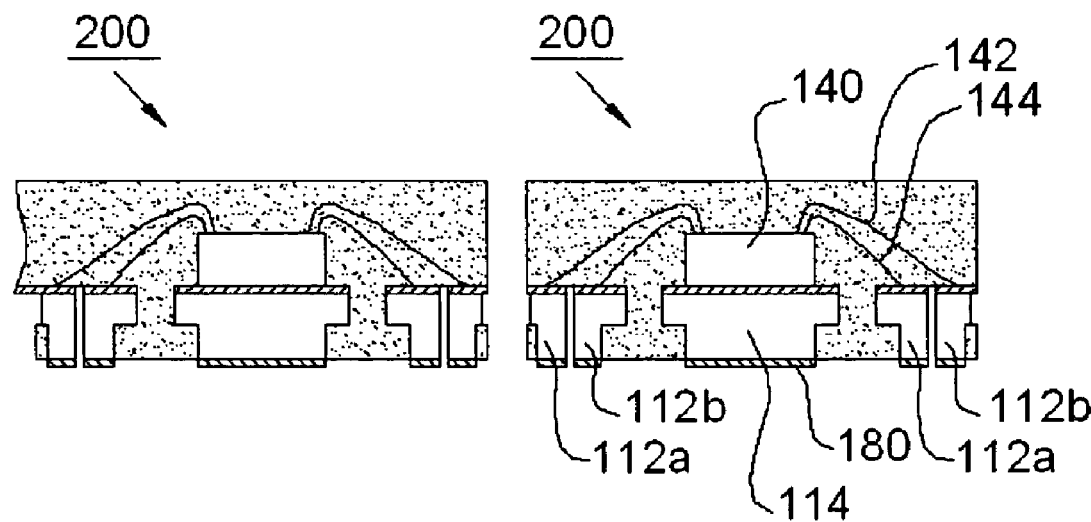
Figure 4:
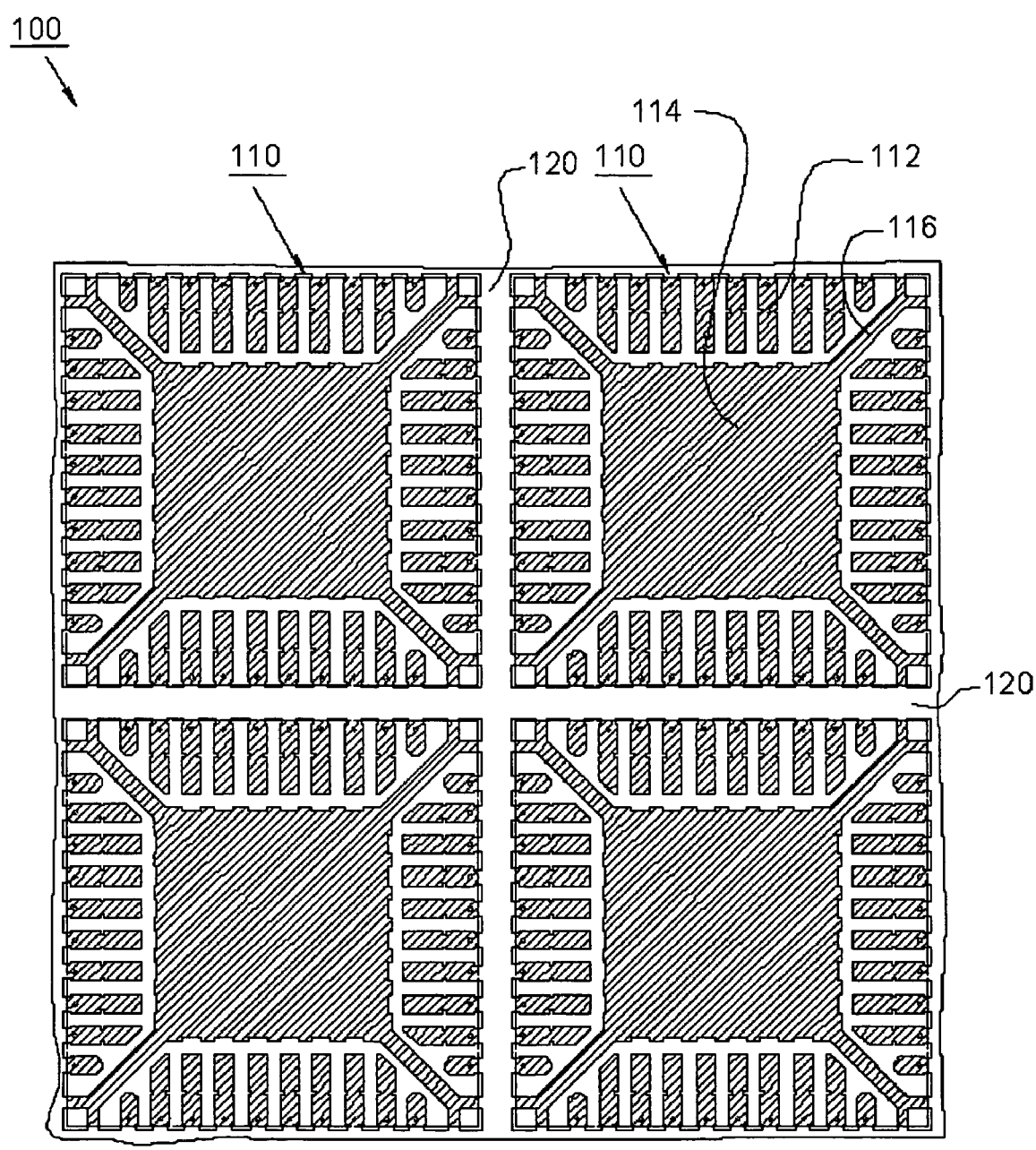
FIG. 4 is a top plan view of a lead frame suitable for use in the process illustrated in FIGS. 3a to 3k.

FIGS. 3a to 3k illustrate in cross-section major steps of a process for making a plurality of staggered dual-row leadless packages using the lead frame 100 shown in FIG. 4 according to one embodiment of the present invention.

As shown in FIG. 4, the lead frame 100 includes a plurality of units 110 in an array arrangement. The units 110 of the lead frame 100 are separated from each other by a plurality of dambars 120 which generally form an orthogonal grid on the lead frame 100. Though only four units 110 are shown in FIG. 4, a lead frame for use with the invention can include any number of units if desired. Each of the units 110 of the lead frame includes a plurality of leads 112 (only one lead is denoted with the numeral 112 in FIG. 4 for simplicity) arranged at the periphery of a die pad 114. Each die pad 11b is connected to the dambars 120 by four tie bars 116 (only one tie bar is denoted with the numeral 116 in FIG. 4 for simplicity). Note that the leads 112, the die pads 114 and the tie bars 116 are hatched in FIG. 4 to facilitate understanding. As shown in FIG. 3a, the upper surface of the leads 112 is substantially flat and no concave portion is provided thereon.

The lead frame for use with the present invention is typically made of a copper-base alloy or made of copper or alloys containing copper, and shaped by pressing or etching. As shown in FIG. 3a, the entire upper surface of lead frame 100 is plated with a first metal layer 130. Preferably, the first metal layer 130 is formed of materials that allow a good bond to the conventional bonding wire material, e.g., silver, gold or palladium.

Referring to FIG. 3a, semiconductor chips 140 are respectively attached to the die pads 114 by means of silver epoxy (not shown), and the epoxy is cured after die attach. After that, a plurality of bonding wires 142 and 144 are connected to the chip 140 and the leads 112 using known wire bonding techniques. Note that each lead 112 is electrically coupled to two different bonding pads of one semiconductor chip 140 via the bonding wire 142 and the bonding wire 144, respectively.

Referring to FIG. 3b, a polyimide (PI) tape 150 is attached onto the lower surface of the lead frame 100, and this is to prevent the mold flash problem in the molding process.

Referring to FIG. 3c, the chips 140 are encapsulated against the upper surface of the lead frame 100 to form a molded product. Usually, a MAP (mold array package) molding process is used to accomplish this encapsulation.

Referring to FIG. 3d, the PI tape 150 is removed after the molding process. After the tape 150 is removed, the lower surface of the lead frame 100 is exposed from the bottom of the molded product.

Referring to FIGS. 3e and 3f, the dambars 120 of the lead frame 100 are selectively etched away by using a photoresist pattern 160 as an etch mask to form a plurality of grooves 120a. As shown in FIG. 3e, the photoresist pattern 160 used herein is formed on the entire lower surface of the lead frame 100 except the dambars 120. Note that the first metal layer 130 between adjacent leads 112 remains substantially intact after the etching step. As shown in FIG. 3f, the photoresist pattern 160 is stripped after the etching step. Note that, after the etching operation, the first metal layer 130 exposed in the grooves 120a is remain intact.

Referring to FIGS. 3g and 3h, each lead 112 of the lead frame 100 is selectively etched away a portion thereof by using a photoresist pattern 170 as an etch mask to form a first connection pad 112a and a second connection pad 112b. As shown in FIG. 3g, the photoresist pattern 170 used herein is formed on the entire lower surface of the lead frame 100 except the portion of each lead 112 predetermined to be etched. As shown in FIG. 3h, the first metal layer 130 between adjacent first connection pads 112a and second connection pads 112b remains substantially intact after the etching step. Therefore, the first connection pad 112a and the second connection pad 112b are separated from each other but are still electrically connected to each other via the first metal layer 130 therebetween.

Referring to FIGS. 3i, after the photoresist pattern 170 is removed, a second metal layer 180 (e.g., a layer of tin/lead) is formed on the first connection pads 112a, the second connection pads 112b and the die pads 114 by electroplating. Note that the first metal layer 130 functions as electric path for current flow.

Referring to FIGS. 3j, the first metal layer 130 located between the first connection pads 112a and the second connection pads 112b is removed to electrically isolate the first connection pads 112a from the second connection pads 112b. This removing step may be accomplished by a water jet or a laser wherein the laser is preferred in view of high accuracy. Specifically, the water jet uses pressurized water to remove the first metal layer 130 located between the first connection pads 112a and the second connection pads 112b. The types of laser usable in the removing step include carbon dioxide laser, YAG (yttrium aluminum garnet) laser, excimer laser, etc., of which carbon dioxide laser is preferred in view of productivity.

Finally, a singulation step is conducted to obtain the staggered dual-row leadless packages 200 shown in FIG. 3k. Specifically, a saw blade may be used to cut through the assembly shown in FIG. 3j into separate packages along the grooves 120a. Since the dambars 120 of the lead frame 100 are etched away, only the encapsulant and the first metal layer 130 exposed in the groove 120a is cut by the blade. The lifetime of the blade is significantly increased by avoiding direct cutting of the dambars 120 of the lead frame 100.

Note that the step of selectively etching away the dambars 120 of the lead frame 100 shown in FIGS. 3e and 3f is not an essential aspect of the present invention. If the dambars 120 are not etched away, the blade must cut through two different materials, i.e., the metal lead frame (the dambars) as well as the encapsulant.

Note that each lead 112 of the lead frame 100 (see FIG. 3g) is selectively etched away a portion thereof thereby forming two rows of connection pads 112a and 112b (see FIG. 3h). In this way, the number of I/O connections is significantly increased while the pitch or spacing between adjacent leads is not required to be reduced. Accordingly, the finished packages 200 (see FIG. 3k) satisfy the need for a significantly higher number of connection pads in a smaller footprint.

The finished package can be mounted onto a substrate, such as a printed circuit board (PC board), like other leadless devices. For example, a PC board is screen printed with a solder paste in a pattern that corresponds to the pattern of the leads exposed from the bottom of the package. The package is then appropriately positioned on the PC board and the solder is reflowed by using the conventional surface mount technology. Alternatively, the leads exposed from the bottom of the package can be printed with solder paste and then mounted onto the PC board. Note that the second metal layer 180 (e.g., the tin/lead layer plated on the connection pads 112a, 112b and the die pads 114 exposed from the bottom of the package) facilitates solderability during the assembly process between the finished package and the substrate.

Figure 5:
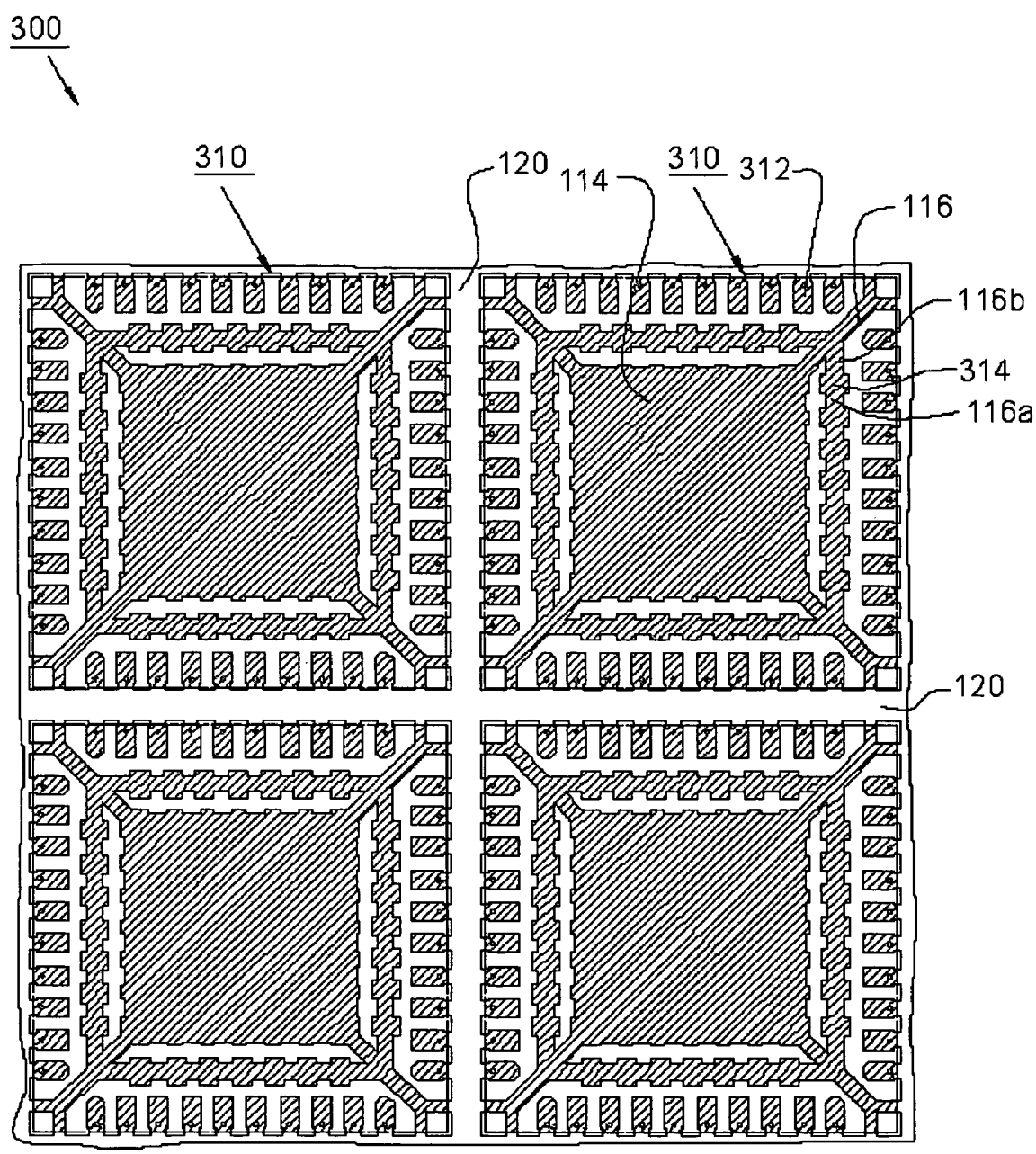
FIG. 5 is a top plan view of a lead frame for making a plurality of staggered dual-row leadless packages according to another embodiment of the present invention.

FIG. 5 illustrates a lead frame 300 for making a plurality of staggered dual-row leadless packages according to another embodiment of the present invention. The lead frame 300 includes a plurality of units 310 separated from each other by a plurality of dambars 120. The lead frame 300 is substantially identical to the lead frame 100 of FIG. 4 with an exception that each unit 310 includes outer leads 312 and inner leads 314 instead of the leads 112. Each of the outer leads 312 is connected to one of the dambars 120. Each of the inner leads 314 is disposed between the outer leads 312 and the die pad 114, and the inner leads 314 are connected to each other and to the tie bars 116. Note that the leads 312 and 314, the die pads 114 and the tie bars 116 are hatched in FIG. 5 to facilitate understanding. The upper surface of the leads 312 and 314 is substantially flat and no concave portion is provided thereon.

The present invention further provides a process for making a plurality of staggered dual-row leadless packages using the lead frame 300 of FIG. 5. This process is substantially identical to the aforementioned process, except that each of the leads 312 and 314 is electrically coupled to one bonding pad of one of the chips, and an etching step is conducted to selectively remove the connecting portions 116a between the inner leads 116 such that the inner leads 116 are separated from each other but are still electrically connected to each other via the first metal layer 130 (not shown in FIG. 5) therebetween. Alternatively, the connecting portions 116b between the inner leads 116 and the tie bars 116 may also be removed in the etching step just described above. In addition, after the second metal layer 180 (not shown in FIG. 5), e.g., a layer of tin/lead, is formed on the leads 312 and 314, the first metal layer 130 located between the inner leads 116 is removed such that the inner leads are electrically isolated from each other. Alternatively, the first metal layer 130 between the inner leads 116 and the tie bars 116 may also be removed in the removing step just described above.

Figure 6:
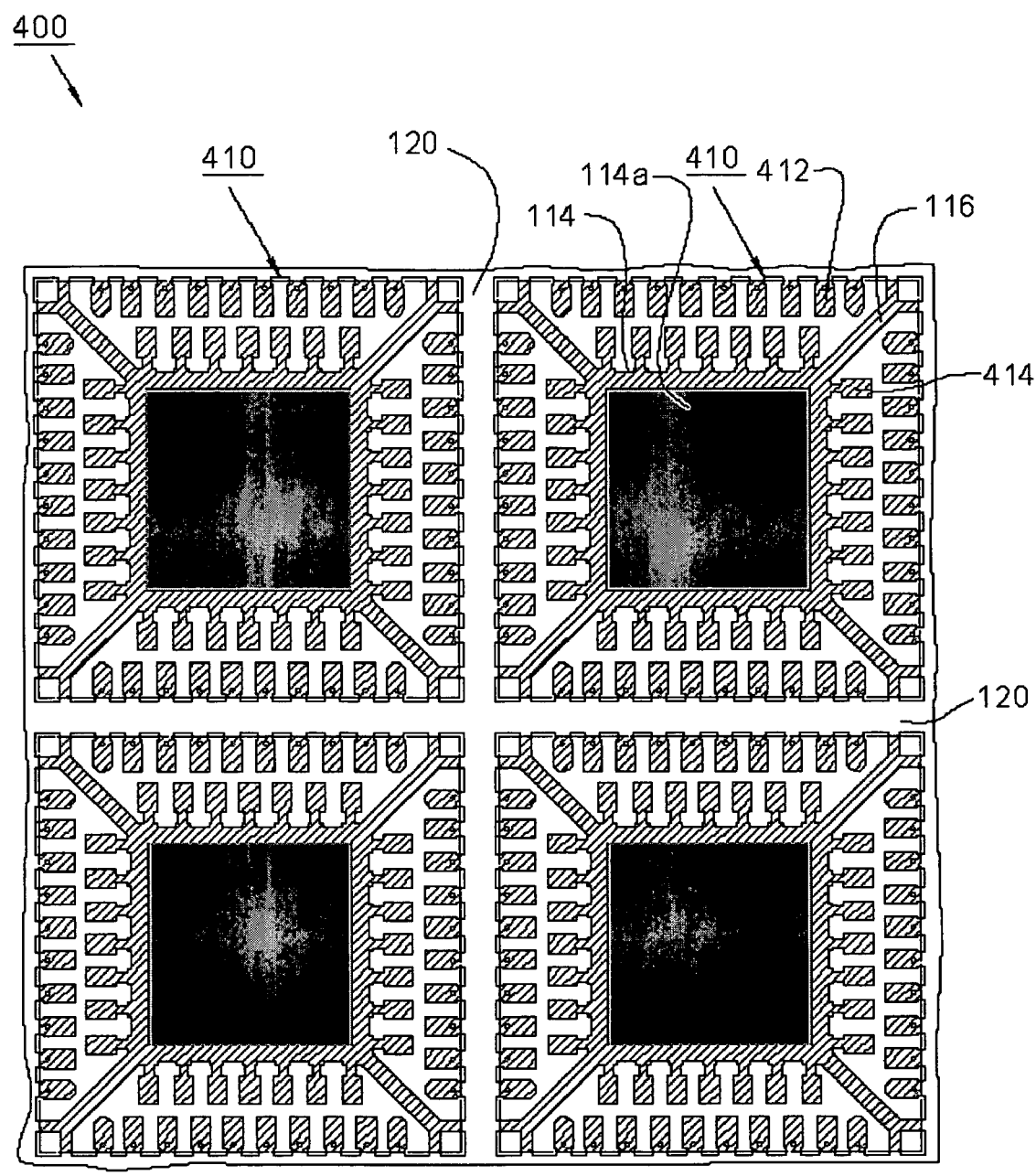
FIG. 6 is a top plan view of a lead frame for making a plurality of staggered dual-row leadless packages according to another embodiment of the present invention.

FIG. 6 illustrates a lead frame 400 for making a plurality of staggered dual-row leadless packages according to another embodiment of the present invention. The lead frame 400 includes a plurality of units 410 separated from each other by a plurality of dambars 120. The lead frame 400 is substantially identical to the lead frame 100 of FIG. 4 with an exception that each unit 410 includes outer leads 412 and inner leads 414 instead of the leads 112. Each of the outer leads 412 is connected to one of the dambars 120. Each of the inner leads 414 connected to one of the die pads 114. The entire upper surface of lead frame 100 is plated with the aforementioned first metal layer 130 (not shown in FIG. 6) except the die receiving areas 114a.

The present invention further provides a process for making a plurality of staggered dual-row leadless packages using the lead frame 400 of FIG. 6. This process is substantially identical to the aforementioned process, except that each of the leads 412 and 414 is electrically coupled to one bonding pad of one of the chips, and an etching step is conducted to selectively remove the connecting portions 414a between the inner leads 414 and the die pad 114 such that the inner leads 414 are separated from the die pad 114 but are still electrically connected to each other via the first metal layer 130 (not shown in FIG. 6) therebetween. In addition, after the second metal layer 180 (not shown in FIG. 6), e.g., a layer of tin/lead, is formed on the leads 412 and 414, the first metal layer 130 located between the inner leads 116 and the die pad 114 is removed such that the inner leads are electrically isolated from each other.

Although the invention has been explained in relation to its preferred embodiment, it is to be understood that many other possible modifications and variations can be made without departing from the spirit and scope of the invention as hereinafter claimed. For example, although only dual-row structure is illustrated as preferred embodiments, the leadless packages with three rows of connection pads or above are still considered within the spirit and scope of the invention.

What is claimed is:

1. A process for making a plurality of leadless semiconductor packages, comprising the steps of:

providing a lead frame having opposing upper and lower surfaces, the lead frame including a plurality of units in an array arrangement, a plurality of dambars between the units, and a first metal layer formed on the entire upper surface of the lead frame wherein each unit includes a die pad and a plurality of leads;

attaching a plurality of chips onto the die pads of the lead frame, wherein each of the chips has a plurality of bonding pads on an active surface thereof;

electrically coupling each lead of the lead frame to two different bonding pads of one of the chips;

encapsulating the chips against the upper surface of the lead frame to form a molded product;

selectively etching away a portion of each lead of the lead frame to form a first connection pad and a second connection pad which are separated from each other but are still electrically connected to each other via the first metal layer therebetween;

electroplating a second metal layer on the first connection pads, the second connection pads and the die pads exposed from the bottom of the molded product by using the first metal layer as an electrical path;

removing the first metal layer located between the first connection pads and the second connection pads such that the first connection pads are electrically isolated from the second connection pads; and conducting a singulation step to obtain the leadless semiconductor packages.

2. The process as claimed in claim 1, further comprising the steps of attaching a tape onto the lower surface of the lead frame before the chips is encapsulated against the lead frame, and removing the tape from the bottom of the molded product.

3. The process as claimed in claim 1, wherein the step of selectively etching away a portion of each lead of the lead frame includes the steps of:

forming a photoresist pattern on the bottom of the molded product such that the entire lower surface of the lead frame is covered with photoresist pattern except the portion of each lead of the lead frame to be etched; and etching the lower surface of the lead frame with the photoresist pattern as mask such that the exposed portion of each lead is etched away while the first metal layer remains substantially intact.

4. The process as claimed in claim 1, wherein the step of removing the first metal layer located between the first connection pads and the second connection pads is accomplished by a laser.

5. The process as claimed in claim 1, wherein the step of removing the first metal layer located between the first connection pads and the second connection pads is accomplished by a water jet.

6. The process as claimed in claim 1, wherein the upper surface of the leads is substantially flat and no concave portion is provided thereon.

7. The process as claimed in claim 1, further comprising a step of selectively etching away the dambars of the lead frame to form a plurality of grooves wherein the singulation step is performed by cutting along the grooves.

8. The process as claimed in claim 7, wherein the step of selectively etching away the dambars of the lead frame includes the steps of:
   forming a photoresist pattern on the bottom of the molded product such that the entire lower surface of the lead frame is covered with the photoresist pattern except the dambars; and
   etching the lower surface of the lead frame with the photoresist pattern as mask such that the dambars are etched away while the first metal layer remains substantially intact.

9. The process as claimed in claim 1, wherein the first metal layer comprises a layer of silver.

10. The process as claimed in claim 1, wherein the second metal layer comprises a layer of tin/lead.

11. A process for making a plurality of leadless semiconductor packages, comprising the steps of:
   providing a lead frame having opposing upper and lower surfaces, the lead frame including a plurality of units in an array arrangement, a plurality of dambars between the units, and a first metal layer formed on the entire upper surface of the lead frame wherein each unit includes a die pad, a plurality of tie bars for connecting the die pad to the dambars, a plurality of outer leads each connected to one of the dambars, and a plurality of inner leads disposed between the outer leads and the die pad wherein the inner leads are connected to each other and the tie bars;
   attaching a plurality of chips onto the die pads of the lead frame;
   electrically coupling the chips to the outer leads and the inner leads of the lead frame;
   encapsulating the chips against the upper surface of the lead frame to form a molded product;
   selectively etching away the connecting portions between the inner leads of the lead frame such that the inner leads are separated from each other but are still electrically connected to each other via the first metal layer therebetween;
   electroplating a second metal layer on the outer leads, the inner leads and the die pads exposed from the bottom of the molded product by using the first metal layer as an electrical path;
   removing the first metal layer located between the inner pads such that the inner leads are electrically isolated from each other; and
   conducting a singulation step to obtain the leadless semiconductor packages.

12. The process as claimed in claim 11, further comprising the steps of attaching a tape onto the lower surface of the lead frame before the chips is encapsulated against the lead frame, and removing the tape from the bottom of the molded product.

13. The process as claimed in claim 11, wherein the step of selectively etching away the connecting portions between the inner leads of the lead frame includes the steps of:
   forming a photoresist pattern on the bottom of the molded product such that the entire lower surface of the lead frame is covered with photoresist pattern except the connecting portions between the inner leads of the lead frame; and
   etching the lower surface of the lead frame with the photoresist pattern as mask such that the connecting portions are etched away while the first metal layer remains substantially intact.

14. The process as claimed in claim 11, further comprises the steps of selectively etching away the connecting portions between the inner leads and the tie bars, and removing the first metal layer located between the inner leads and the tie bars such that the inner leads and the tie bars are electrically isolated from each other.

15. The process as claimed in claim 14, wherein the connecting portions between the inner leads of the lead frame as well as between the inner leads and the tie bars are selectively etched away by the steps of:
   forming a photoresist pattern on the bottom of the molded product such that the entire lower surface of the lead frame is covered with photoresist pattern except the connecting portions between the inner leads of the lead frame as well as between the inner leads and the tie bars; and
   etching the lower surface of the lead frame with the photoresist pattern as mask such that the connecting portions are etched away while the first metal layer remains substantially intact.

16. The process as claimed in claim 11, wherein the step of removing the first metal layer located between the inner pads is accomplished by a laser.

17. The process as claimed in claim 11, wherein the step of removing the first metal layer located between the inner pads is accomplished by a water jet.

18. The process as claimed in claim 11, wherein the upper surface of the leads is substantially flat and no concave portion is provided thereon.

19. The process as claimed in claim 11, further comprising a step of selectively etching away the dambars of the lead frame to form a plurality of grooves wherein the singulation step is performed by cutting along the grooves.

20. The process as claimed in claim 11, wherein the step of selectively etching away the dambars of the lead frame includes the steps of:
   forming a photoresist pattern on the bottom of the molded product such that the entire lower surface of the lead frame is covered with the photoresist pattern except the dambars; and
   etching the lower surface of the lead frame with the photoresist pattern as mask such that the dambars are etched away while the first metal layer remains substantially intact.

21. The process as claimed in claim 11, wherein the first metal layer comprises a layer of silver.

22. The process as claimed in claim 11, wherein the second metal layer comprises a layer of tin/lead.

* * * * *